United States Patent
Abatchev et al.

(10) Patent No.: US 7,563,723 B2
(45) Date of Patent: Jul. 21, 2009

(54) CRITICAL DIMENSION CONTROL FOR INTEGRATED CIRCUITS

(75) Inventors: Mirzafer K. Abatchev, Boise, ID (US); David K. Hwang, Boise, ID (US); Robert G. Veltrop, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/498,707

(22) Filed: Aug. 3, 2006

(65) Prior Publication Data

US 2006/0270230 A1 Nov. 30, 2006

Related U.S. Application Data

(63) Continuation of application No. 10/931,772, filed on Aug. 31, 2004, now Pat. No. 7,271,106.

(51) Int. Cl.
*H01L 21/302* (2006.01)
(52) U.S. Cl. .................. 438/714; 438/706; 430/313
(58) Field of Classification Search ............... 438/706, 438/710, 712, 714, 720, 717; 430/313, 314
See application file for complete search history.

(56) References Cited

U.S. PATENT DOCUMENTS

| | | | |
|---|---|---|---|
| 4,687,543 A | 8/1987 | Bowker | |
| 6,242,165 B1 | 6/2001 | Vaartstra | |
| 6,579,808 B2 | 6/2003 | Cho et al. | |
| 6,716,758 B1 | 4/2004 | Donohue et al. | |
| 6,864,556 B1* | 3/2005 | You et al. ................. | 257/437 |
| 7,172,972 B2* | 2/2007 | Goto et al. ................ | 438/706 |
| 2002/0094641 A1* | 7/2002 | Shin et al. ................. | 438/257 |
| 2003/0209520 A1 | 11/2003 | Chen et al. | |
| 2004/0106257 A1 | 6/2004 | Okamura et al. | |
| 2004/0157444 A1* | 8/2004 | Chiu et al. ................. | 438/689 |
| 2004/0259355 A1* | 12/2004 | Yin et al. ................... | 438/689 |
| 2005/0009215 A1 | 1/2005 | Goto et al. | |
| 2005/0026431 A1 | 2/2005 | Kazumi et al. | |
| 2005/0099078 A1 | 5/2005 | Vanhaelemeersch et al. | |
| 2005/0127416 A1 | 6/2005 | Han et al. | |
| 2005/0164478 A1 | 7/2005 | Chan et al. | |
| 2007/0264830 A1* | 11/2007 | Huang et al. ............... | 438/694 |

OTHER PUBLICATIONS

*Advanced lithography: probing the limits of lithography*, http://www.tpd.tno.nl/smartsite93.html, 3 pages (Mar. 2004).

(Continued)

*Primary Examiner*—Lan Vinh
(74) *Attorney, Agent, or Firm*—Knobbe Martens Olson & Bear LLP

(57) ABSTRACT

Methods of etching substrates with small critical dimensions and altering the critical dimensions are disclosed. In one embodiment, a sulfur oxide based plasma is used to etch an amorphous carbon hard mask layer. The features of a pattern can be shrunk using a plasma etch to reduce the resist elements on the surface of the masking structure. Features in the pattern can also be enlarged by depositing polymer on the resist elements or by sloping an underlying layer. In one preferred embodiment, features of the pattern are shrunk before being enlarged in order to reduce line edge roughness.

18 Claims, 11 Drawing Sheets

OTHER PUBLICATIONS

Bergeron, *Resolution enhancement techniques for the 90-nm technology node and beyond*, Future Fab Intl., http://www.future-fab.com, 10 pages (2004).

Ha, et al., *Reaction mechanism of trilevel resist etching in $O_2/SO_2$ plasma: controlling factors for sidewall passivation*, Vacuum, vol. 51, Issue 4, pp. 519-524, abstract (Dec. 1998).

Higashi, et al., *Identifying front-end challenges for 90nm design*, Electronic Eng. Times Asia, 3 pages (Sep. 1, 2003).

Mancini, et al., *S-FIL for sub-80nm contact hole patterning*, Solid State Technology Magazine, vol. 47, issue 2, 4 pages (Feb. 2004).

Peterson, et al., *Approaches to reducing edge roughness and substrate poisoning of ESCAP photoresists*, Semiconductor Fabtech, $8^{th}$ Edition, pp. 183-188.

Naulleau, et al., *Line-edge roughness transfer function and its application to determining mask effects in EUV resist characterization*, Applied Optics, vol. 42, No. 17, pp. 3390-3397 (Jun. 10, 2003).

TCP 9400DFM—Silicon Etch Product Abstract, http://www.lamrc.com/products_5.htm, 1 page (Jul. 2004).

* cited by examiner

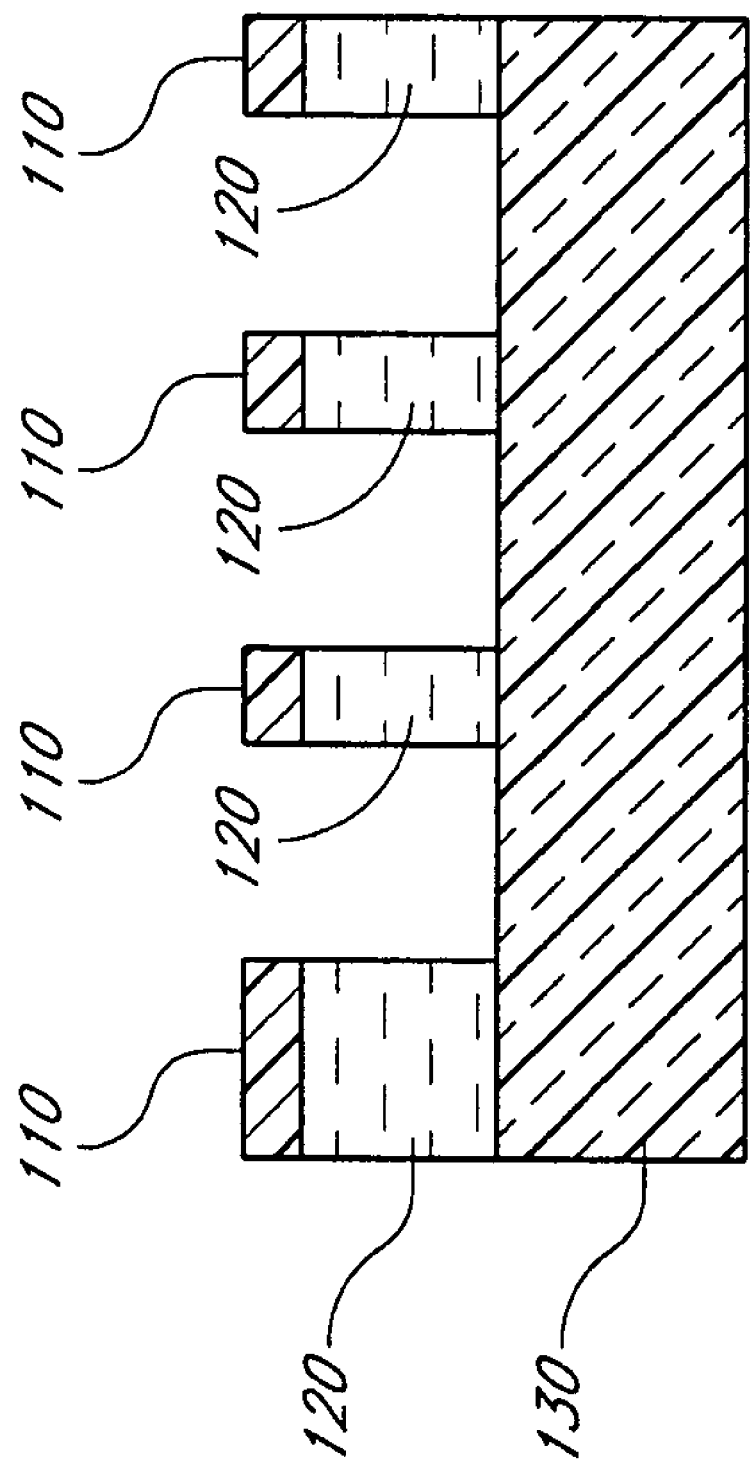

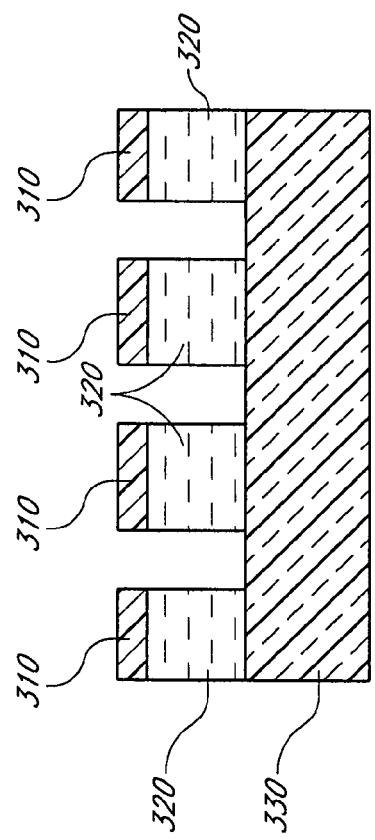
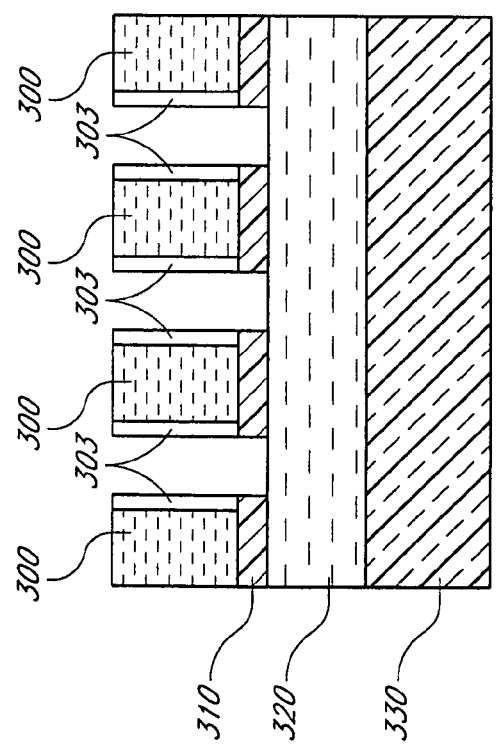
FIG. 3C
FIG. 3D

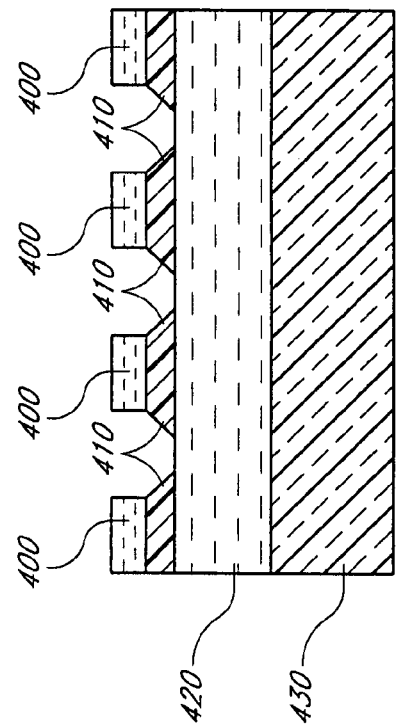
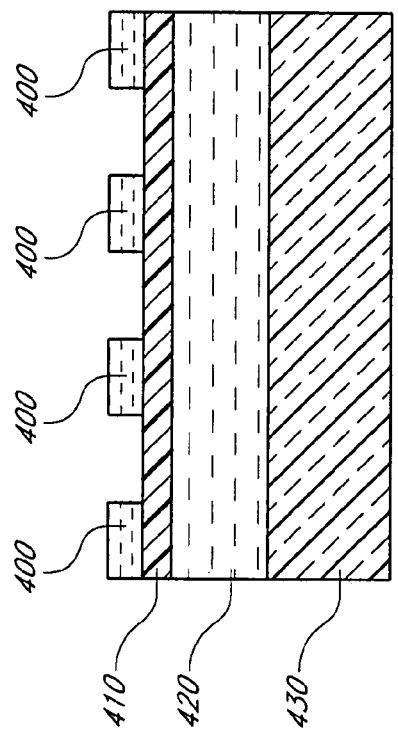
FIG. 4A
FIG. 4B

CRITICAL DIMENSION CONTROL FOR INTEGRATED CIRCUITS

CROSS REFERENCE TO RELATED APPLICATION

This application is a continuation of U.S. application Ser. No. 10/931,772, filed Aug. 31, 2004, now issued as U.S. Pat. No. 7,271,106, the disclosure of which is incorporated by reference.

FIELD OF THE INVENTION

The present invention relates to the field of integrated circuit fabrication, particularly to the etching process.

BACKGROUND OF THE INVENTION

Computer memory, like other integrated circuit (IC) devices, is getting faster, more cost-efficient, and more powerful. Dynamic Random Access Memory (DRAM) is a type of computer memory that stores information in memory cells, which typically comprise a transistor latched to a capacitor.

The critical dimension (CD) is the dimension of the smallest geometrical features (width of interconnect line, contacts, trenches, etc.) which can be formed during semiconductor device manufacturing. Critical dimensions are shrinking in order to facilitate, the formation of smaller components and faster, more efficient circuits. However, adjusting the CD and providing proper patterning for underlying substrates can be difficult when using only a photoresist soft mask.

Line edge roughness (LER) has tended to be one product of decreasing critical dimensions. Poor line edge roughness can lead to poor performance of the eventual device. LER is a measurement of the unwanted edges and bumps on a resist feature. As CDs continue to shrink, the roughness as a percentage of the feature size becomes far greater due to the smaller feature size. According to the 2001 International Technology Roadmap for Semiconductors (ITRS) the roughness that can be tolerated for a 70-65 nm line is only around 3 nm, which is difficult to achieve using current technology. Thus, there is a need to reduce LER and to reliably reduce CD of integrated circuits.

SUMMARY OF THE INVENTION

In one aspect of the invention, a method of etching for an integrated circuit with a carbon layer is disclosed. The method comprises forming a pattern with features in a first hard mask layer. The features correspond to a plurality of physical elements of the first hard mask layer. The pattern is transferred into a carbon layer beneath the first hard mask layer with a sulfur oxide based plasma.

In another aspect of the invention, a method of altering a critical dimension in an integrated circuit is disclosed. The method comprises patterning a photoresist layer to form a plurality of resist elements and shrinking the resist elements. A first hard mask layer is etched to form a pattern corresponding to the resist elements after shrinking the resist elements. The method further comprises transferring the pattern from the first hard mask layer into a carbon layer beneath the first hard mask layer using a plasma containing sulfur and oxygen.

In another aspect of the invention, a method of etching a substrate is disclosed. The method comprises patterning a photoresist layer to form a plurality of original features. A pattern is formed with a plurality of smaller features in a carbon hard mask layer by using a sulfur oxide plasma etch process. The smaller features correspond to the original features. The method further comprises etching a substrate using the pattern.

In another aspect of the invention, a method of altering a critical dimension in an integrated circuit is disclosed. The method comprises forming a photoresist layer with a plurality of elements to create a pattern with a plurality of features. The features correspond to the elements. The features are grown after creating the pattern. The method further comprises transferring the pattern to a carbon hard mask layer beneath the photoresist layer using a sulfur dioxide plasma etch.

In another aspect of the invention, a method of etching a substrate is disclosed. The method comprises forming a plurality of physical elements of a resist layer to define a pattern with a plurality of features. The features correspond to the elements. The pattern is transferred to a first hard mask layer. Using the first hard mask layer, an amorphous carbon layer over a substrate is etched with a sulfur based plasma. The amorphous carbon layer is used as a hard mask for etching the substrate after using the first hard mask layer to etch the amorphous carbon layer.

A method of etching a substrate is disclosed in another aspect of the invention. The method comprises patterning a photoresist layer. The photoresist layer is used to form a plurality of features in a pattern in at least one hard mask layer beneath the photoresist layer. At least one shrinkage step and at least one growth step are performed after patterning the photoresist layer and before etching a substrate beneath the hard mask.

A method of etching amorphous carbon in an integrated circuit is disclosed in another aspect of the invention. The method comprises using a sulfur oxide based plasma to etch an amorphous carbon layer.

BRIEF DESCRIPTION OF THE DRAWINGS

FIGS. 1A-1C illustrate the formation of a hard mask according to an embodiment of the invention.

FIGS. 3A-3D illustrate the growth of polymer on resist elements to form a hard mask with an altered critical dimension according to an embodiment of the invention.

FIGS. 4A-4C illustrate the sloping of an underlayer to form a hard mask with an altered critical dimension according to an embodiment of the invention.

DETAILED DESCRIPTION OF THE PREFERRED EMBODIMENT

Definitions

In the context of this document, the term "semiconductor substrate" is defined to mean any construction comprising semiconductor materials, including, but not limited to, bulk semiconductor materials such as a semiconductor wafer (either alone or in assemblies comprising other materials thereon), and semiconductor material layers (either alone or in assemblies comprising other materials). The term "substrate" refers to any supporting substrate, including, but not limited to, the semiconductor substrates described above. Also in the context of this document, the term "layer" encompasses both the singular and the plural unless otherwise indicated. As used herein, the term "organic" refers to carbon and carbon-containing materials, thus including amorphous carbon as well as photoresists. Also note that "sulfur oxide," as used herein, means any compound consisting essentially of a combination of sulfur and oxygen, such as sulfur dioxide.

It will also be appreciated that transferring a pattern from a first level to a second level involves forming features in the second level that generally correspond to features on the first level. For example, the path of lines in the second level will generally follow the path of lines on the first level and the location of other features on the second level will correspond to the location of similar features on the first level. The precise shapes and sizes of features can vary from the first level to the second level, however due, for example, to the shrinkage and growth steps described above. For example, depending upon etch chemistries and conditions, the sizes of and relative spacings between the features forming the transferred pattern can be enlarged or diminished relative to the pattern on the first level, while still resembling the same initial "pattern."

"Features," as used herein, refers to parts of the pattern, such as lines or gaps, and thus represents an abstract construction. "Elements" will be used to describe physical parts of mask layers that correspond to features. Thus, a soft mask and a hard mask can both include the same pattern of features, but represented by different physical elements. Moreover, the physical elements representing the same pattern features at different mask levels can have different dimensions.

Etching into underlying layers or structures with small CDs can be troublesome. It is typically quite difficult to etch deep into a substrate for small features. One major problem with etching a substrate when only using photoresist is that the photoresist pattern gets altered by the etch process by the time the etch is complete. This causes the substrate to be etched outside of the desired pattern. Poor etching can cause defects in the performance of the device and poor yields.

Figure 1A:
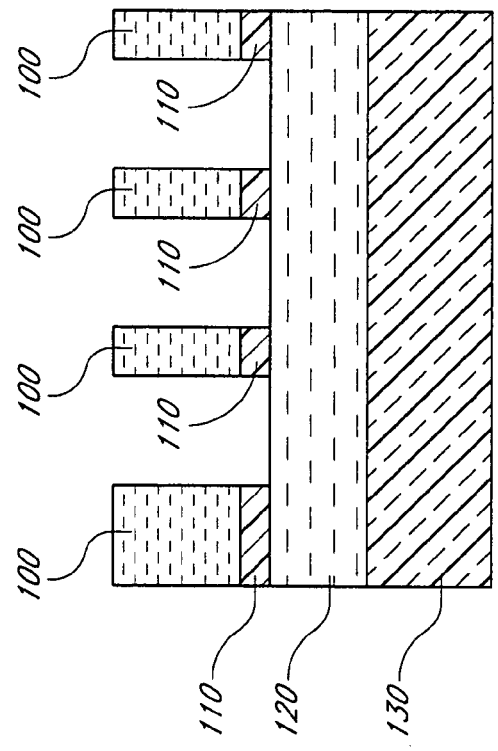

One method of avoiding this problem is to use multiple hard masks as seen in FIG. 1A. In this method, a pattern in a photoresist layer 100 is used to etch a first hard mask layer 110. In preferred embodiments, the first hard mask layer 110 is an inorganic hard mask material. Preferably, a fluorocarbon-based plasma dry develop etch is used to transfer a pattern from a photoresist layer 100 to the first hard mask layer 110. The first hard mask layer 110 is then used to etch a second hard mask layer 120.

In a preferred embodiment, the second hard mask layer 120 is an organic layer, more preferably an amorphous carbon layer. A $SO_2$-based plasma dry develop etch can be used to transfer the pattern into the second hard mask layer 120. In this dry develop etch (DDE) process, the second hard mask layer 120 is etched to form a hard mask. The substrate 130 can be etched using the second hard mask layer 120. As noted below, in this context the substrate 130 can be a semiconductor material as illustrated in the figures, or the substrate to be etched can include other materials such as metals or insulators.

A DDE process can also be used in conjunction with modification or alteration of the size of the features in a pattern of a mask layer. For example, the width of the resist elements in the photoresist layer 100 can be reduced or grown. In several embodiments described herein, a photoresist mask is altered using the DDE process. In FIGS. 2A-2D, and in the accompanying disclosure, a pattern in a photoresist is shrunk to form a smaller pattern. FIGS. 3A-3D show features in a pattern being grown using polymer deposition. FIGS. 4A-4D show features in a pattern being grown during the process of transferring a pattern to an underlying hard mask by sloping sidewalls of the corresponding hard mask elements. Finally, FIGS. 5A-5D show features in a pattern that are modified by using a shrinkage step along with a growth step to provide smooth edges. While the processes described herein use particular materials that are especially suitable, the processes are not limited to these materials. It will also be understood that modifications such as feature shrinkage or growth can be performed at the soft (resist) mask or hard mask stages.

Hard Mask Creation

As seen in FIG. 1A, a photoresist layer 100 is formed over a first hard mask layer 110. The photoresist layer 100 is patterned using any suitable photoresist processing technique. Examples of preferred materials include photoresists sensitive to common wavelengths of light employed in lithography, including 248 nm, 193 nm, and 157 nm. Preferably, the photoresist layer 100 is between about 1500 Å and 2500 Å, more preferably between about 1750 Å and 2250 Å. The first hard mask layer 110 is preferably insulating, preferably inorganic, and more preferably selected from a group of materials including dielectric anti-reflective coatings (DARC) (e.g., silicon oxynitride ($SiO_xN_y$), silicon oxide ($SiO_2$), or other inorganic materials. The first hard mask layer 110 is preferably between about 150 Å and 900 Å, more preferably between about 200 Å and 750 Å.

A bottom anti-reflective coating (BARC) layer (not pictured) can optionally be used between the first hard mask layer 110 and the photoresist layer 100. BARCs, which are typically organic, enhance the resolution by preventing reflections of the ultraviolet (UV) radiation that activates the photoresist. BARCs are widely available, and are usually selected based upon the selection of the resist material and the UV wavelength. BARCs, which are typically polymer based, are usually removed along with the accompanying photoresist. The optional BARC layer is preferably between about 150 Å and 350 Å, more preferably between about 200 Å and 300 Å.

The first hard mask layer 110 is preferably used as a hard mask for a second hard mask layer 120. In a preferred embodiment, the second hard mask layer 120, which is preferably directly beneath the first hard mask layer 110, is an organic material, such as amorphous carbon. A preferred type of amorphous carbon is a colorless, transparent carbon that facilitates photo alignment to underlying layers. Because hard mask layer 120 is preferably thick, an opaque film could hinder photo alignment. Preferably, the second hard mask layer 120 is quite thick in order to improve processing of the substrate 130. The second hard mask layer 120 is preferably between about 2000 Å and 14,000 Å, more preferably between about 2500 Å and 12,000 Å. The second hard mask layer 120 overlies the structure to be processed (e.g., etched). That structure is represented by the substrate 130. A thick second hard mask layer 120 stands up better to processing through the hard mask. Selective etching of the substrate, especially deep trenches, subjects the hard mask to erosion. Even with high selectivity, prolonged exposure to etchants during etching of deep trenches can completely erode a thin hard mask.

The etching processes of the first hard mask layer 110 and the second hard mask layer 120 are preferably performed in the same chamber. Preferably the hard masks 110 and 120 are etched using a plasma etch process, most preferably a high density plasma etch process. Preferred chambers include Lam Research Corp.'s (Fremont, Calif.) TCP9400 poly etch chamber, and Applied Materials Corp.'s (Santa Clara, Calif.) IPS oxide etch chamber.

Figure 1B:
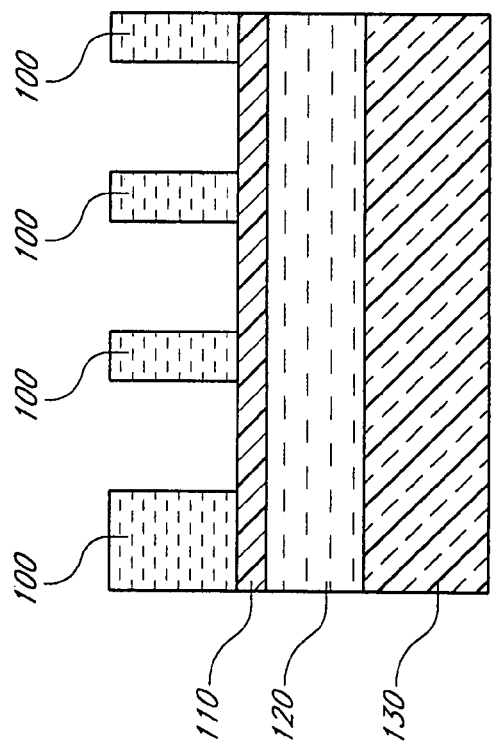

In FIG. 1B, the pattern from the photoresist layer 100 has been transferred into the first hard mask layer 110. The transfer is preferably accomplished using a fluorocarbon plasma dry etch. A dry etch, preferably employing high density plasma, can be used to provide patterning of the first hard mask layer 110 in a manner faithful to the resist elements. Preferred precursor gases include $CF_4$, $N_2$, $O_2$, and Ar. The power levels and flow rates will vary based upon the selected chamber. Skilled artisans will appreciate that there are several possible etch processes that can be used to transfer the pattern from the photoresist layer 100 into the first hard mask layer 110.

In one unpictured embodiment, the physical elements of the photoresist layer are used to form several elements of a future mask. The pattern is transferred to an underlying layer, such as the first hard mask layer 110. The photoresist layer 100 is then removed. A spacer material is blanket deposited over the physical elements of the underlying layer. Preferred spacer materials include silicon nitrides and oxides. A spacer etch is performed on the spacer material to create sidewall spacers on the physical elements of the first underlying layer. The physical elements of the first underlying layer are selectively removed against the spacer material. The spacers can then be used as a hard mask with a different pattern compared to the pattern of the photoresist. Details of similar processes are disclosed in U.S. Pat. No. 5,328,810, issued to Lowrey et al., the disclosure of which is incorporated herein by reference.

Preferably, the chamber that was employed to etch the first hard mask layer 110 is used to etch the second hard mask layer 120. After the first hard mask layer 110 has been etched, the chamber is purged during a transition step. The ionizing source power is left on in the chamber, but the bias power is turned off. The plasma from the etching of the first hard mask layer 110, preferably a fluorocarbon based plasma, is purged from the chamber.

In FIG. 1C, the pattern from the first hard mask layer 110 has been transferred into the second hard mask layer 120. The second hard mask layer 120 is preferably organic, more preferably amorphous carbon. Preferably, the etch process is a dry develop etch (DDE) process. Preferably, the etchant includes sulfur and oxygen and is preferably a plasma. In the illustrated embodiment, a sulfur dioxide ($SO_2$) based plasma is used as an etchant in a process referred to as a DDE carbon etch step. Preferably, the plasma process uses inert gases to help support the plasma.

One preferred chamber for such an etch is Lam Research Corp.'s TCP9400 poly etch chamber. In this chamber, the pressure is preferably between 3 mTorr and 20 mTorr, more preferably between about 5 mTorr and 15 mTorr. The ionizing source power, preferably delivered in situ, is preferably between 175 W and 400 W, more preferably between about 225 W and 350 W. The bias power is preferably between about 25 W and 125 W, more preferably between about 30 W and 100 W. The electrode temperature is preferably targeted to be between about −5° C. and 15° C., more preferably between about 0° C. and 10° C. Using this chamber, preferred precursor gases include $SO_2$, $O_2$, and Ar. In a preferred embodiment with a single wafer, the flow rate for $SO_2$ is preferably between about 10 sccm and 75 sccm, more preferably between about 20 sccm and 60 sccm. The flow rate for $O_2$ is preferably between about 10 sccm and 100 sccm, more preferably between about 20 sccm and 80 sccm. The flow rate for Ar is preferably between about 0 sccm and 175 sccm, more preferably between about 0 sccm and 140 sccm.

In another preferred chamber, Applied Materials Corp.'s IPS oxide etch chamber, the pressure is preferably between 5 mTorr and 20 mTorr, more preferably between about 7 mTorr and 16 mTorr. The in situ ionizing source power is preferably between 350 W and 1200 W, more preferably between about 400 W and 1000 W. The bias power is preferably between about 40 W and 150 W, more preferably between about 50 W and 130 W. The electrode temperature is between about −25° C. and 15° C., more preferably between about −20° C. and 10° C. Using this chamber, preferred precursor gases include $SO_2$, $O_2$, $N_2$ and Ar. In a preferred embodiment with a single wafer, the flow rate for $SO_2$ is preferably between about 10 sccm and 75 sccm, more preferably between about 20 sccm and 60 sccm. The flow rate for $O_2$ is preferably between about 0 sccm and 100 sccm, more preferably between about 0 sccm and 90 sccm. The flow rate for Ar is preferably between about 0 sccm and 175 sccm, more preferably between about 0 sccm and 150 sccm. The flow rate for $N_2$ is preferably between about 0 sccm and 125 sccm, more preferably between about 0 sccm and 100 sccm.

Using a $SO_2$-based plasma, the second hard mask layer 120, which is preferably amorphous carbon is etched with very high selectivity relative to the material of the preferred first hard mask layer 110. The selectivity of the DDE etching process helps provide an excellent mask for the printing of features on the substrate 130. Preferably, the second hard mask layer 120 is etched at a rate of above about 20 times faster than the etch rate of the material(s) of the underlying substrate 130, more preferably above about 40 times faster. With preferred materials a rate of selectivity above 100 can be attained. Preferably, the second hard mask layer 120 is etched at a rate of above about 15 times faster than the etch rate of the first hard mask layer 110, more preferably above about 30 times faster.

Once the second hard mask layer 120 is patterned, it can be used to process (e.g., etch) the substrate 130. The substrate can include silicon, silicon oxide, silicon nitride, metal or any other material that needs to be selectively processed (e.g., etched) through a mask during the course of integrated circuit fabrication. In a preferred embodiment, the substrate is processed in the same chamber, but the wafer could also be transported to a different chamber for subsequent processing. The substrate 130 is preferably etched using an etch chemistry appropriate for the selected substrate.

An etch stop layer (not pictured) can be used between the second hard mask 120 and the substrate 130. The etch stop is preferably similar materials to those used for the first hard mask layer 110, including DARC and silicon nitride. The etch stop avoids damage to the substrate 130 during the etching of the second hard mask layer 120, such as during pattern transfer to the second hard mask layer 120 or during removal of the second hard mask layer 120. This is particularly important when the substrate 130 is a metal, such as a metallization layer. Metal etched in the DDE chamber can contaminate the chamber and slow down processing. If the substrate 130 includes an exposed metal layer, the wafer is preferably transported to a metal etch chamber for further processing.

By using amorphous carbon as the second hard mask layer 120 with the preferred $SO_2$-based etching process, clean features result, as well as highly selective etching through the mask. When processing (e.g., etching) of the substrate is completed, any remaining hard mask material may be removed by known etch processes, such as a wet etch step.

Shrinking the CD Through a Trim Etch

Referring to a preferred embodiment illustrated in FIGS. 2A-2D, the features in the pattern are preferably shrunk between developing the elements in the resist layer 200 and etching the substrate 230. The features can be reduced in size before, during, or after transferring the pattern from the photoresist layer 200 to the first hard mask layer 210. Preferably, the physical elements of a pattern in a mask are etched isotropically to form elements that are both more narrow and more thin. In a more preferred embodiment, the elements of a resist layer 200 are shrunk using a plasma etch process, more preferably a sulfur and oxygen based plasma etch process.

Figure 2B:
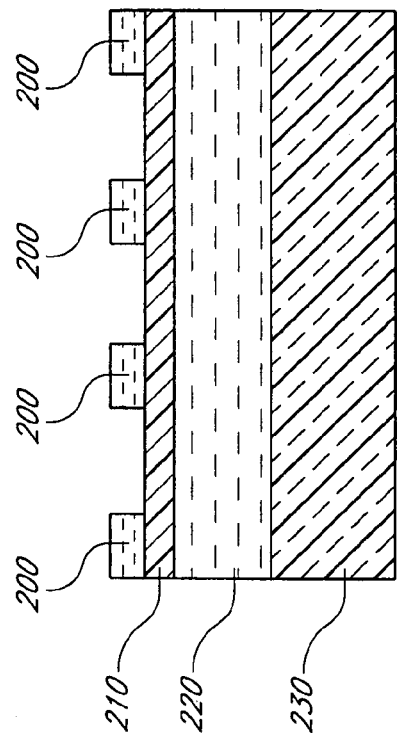
FIGS. 2A-2D illustrate the reduction of resist elements to form a hard mask with an altered critical dimension according to an embodiment of the invention.
Figure 2A:
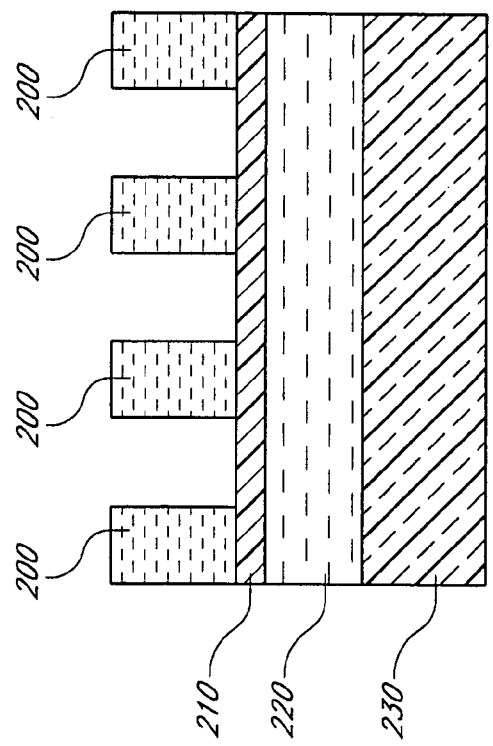
Figure 2D:
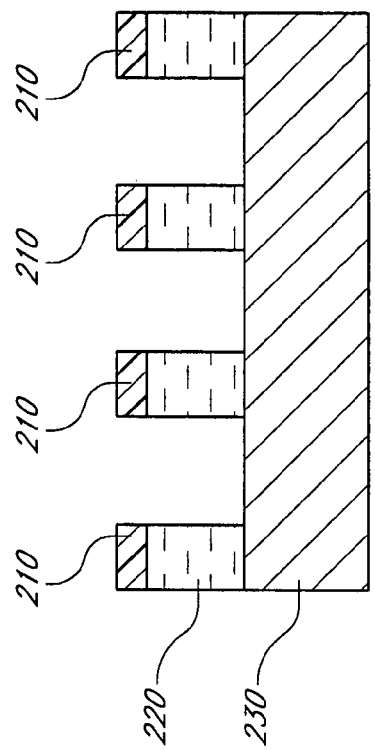

As can be seen in FIGS. 2A-2D, this process can be used to make the printing of small features, such as conductive lines, more reliable. The multi-layer mask as explained above is also used in this process, with an optional BARC layer (not shown) as an anti-reflective coating (ARC) directly below the photoresist layer 200. The photoresist is exposed and developed to form a first pattern. A shrinkage step is performed on the physical elements of the resist. The pattern can be transferred from the photoresist layer 200 to the first hard mask layer 210. The first mask layer 210 serves as a hard mask for etching the second hard mask layer 220. The pattern is transferred to the second hard mask layer 220, preferably using the DDE carbon etch process described above. The thicknesses of the layers are similar as described above. However, a thicker photoresist layer 200 can be used to ensure proper pattern transfer from the photoresist layer 200 to the first hard mask layer 210 after the trim step, which will decrease the thickness of the photoresist layer 200. In FIG. 2A, the photoresist layer preferably has a thickness of between about 1750 Å and 2750 Å, more preferably between about 2000 Å and 2500 Å.

Preferably, the trim step uses a dry develop process. More preferably, a high density plasma formed from a $SO_2$ precursor is used to shrink the resist without bias power so that the etch will be isotropic. In FIG. 2B, the first pattern in the photoresist layer 200 have been shrunk by a trim step, such as a dry develop etch (DDE) process. As above, exemplary single wafer process recipes are provided for two preferred chambers, Lam's TCP9400 poly etch chamber and Applied Materials IPS oxide etch chamber. Using Lam's TCP9400 poly etch chamber, the pressure is preferably between 3 mTorr and 20 mTorr, more preferably between about 5 mTorr and 15 mTorr. The ionizing source power is preferably between 75 W and 500 W, more preferably between about 100 W and 400 W. The bias power is preferably less than 50 W, more preferably the bias power is turned off. The electrode temperature is between about −5° C. and 15° C., more preferably between about 0° C. and 10° C. Preferred precursor gases include $SO_2$, $O_2$, Ar, and He. Preferably the plasma is formed within the chamber. In a preferred single wafer embodiment, the flow rate for $SO_2$ is preferably between about 5 sccm and 75 sccm, more preferably between about 10 sccm and 60 sccm. The flow rate for $O_2$ is preferably between about 0 sccm and 100 sccm, more preferably between about 0 sccm and 80 sccm. The flow rate for Ar is preferably between about 0 sccm and 175 sccm, more preferably between about 0 sccm and 140 sccm. The flow rate for He is preferably between about 0 sccm and 175 sccm, more preferably between about 0 sccm and 140 sccm.

Using Applied Materials' IPS oxide etch chamber, the pressure is preferably between 5 mTorr and 25 mTorr, more preferably between about 7 mTorr and 20 mTorr. The ionizing source power is preferably between 350 W and 1300 W, more preferably between about 400 W and 1200 W. The bias power is preferably less than 25 W, more preferably the bias power is turned off. The electrode temperature is preferably between about −30° C. and 15° C., more preferably between about −20° C. and 10° C. Preferably the plasma is formed within the chamber. Preferred precursor gases include $SO_2$, $O_2$, Ar, and $N_2$. In a preferred single wafer process, the flow rate for $SO_2$ is between about 5 sccm and 60 sccm, more preferably between about 10 sccm and 50 sccm. The flow rate for $O_2$ is preferably between about 0 sccm and 40 sccm, more preferably between about 0 sccm and 30 sccm. The flow rate for Ar is preferably between about 0 sccm and 175 sccm, more preferably between about 0 sccm and 150 sccm. The flow rate for $N_2$ is preferably between about 0 sccm and 175 sccm, more preferably between about 0 sccm and 150 sccm.

The plasma formed in the deposition chamber performs an isotropic etch upon the photoresist layer 200, altering the first pattern to form a smaller pattern. By using a low or no bias power, the plasma etches isotropically rather than anisotropically. Bias power increases the velocity at which the ions of the plasma are traveling. By using a lower bias power, the ions of the plasma are less directed towards the wafer and are more free to drift to etch the sides of the resist elements in the photoresist layer 200. In this manner, the photoresist layer 200 is etched from three sides, which reduces the width as well as the height of the elements of the photoresist layer 200. However, the photoresist layer 200 is only used to pattern the first hard mask layer 210. Because the first hard mask layer 210 can be etched quickly, the loss of resist height will not cause substantial problems when transferring the smaller pattern from the photoresist layer 200 to the first hard mask layer 210.

Using the trim etch step, a feature width can be reduced dramatically. For example, using 2000 Å of photoresist, a group of 103 nm resist elements were reduced to 52 nm. This allows the printing of features in a variety of sizes. However, during shrinkage, the thickness of the resist layer 200 also decreases due to the isotropic nature of the trim etch step. Relatively little photoresist is necessary for the first hard mask layer 210 etch process. The first hard mask layer 210 is quite thin with a thickness of preferably between about 150 Å and 900 Å, more preferably between about 200 Å and 750 Å. Additionally, the selectivity of the etch steps which transfer the smaller features in the pattern between layers also alleviates the impact of the reduction in thickness of the resist.

Figure 2C:
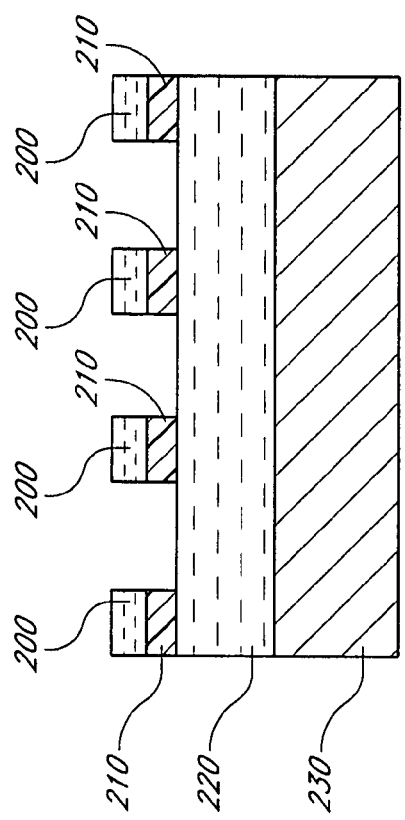

In FIG. 2C, the first hard mask 210 has been etched to form physical elements corresponding to the smaller physical elements of the modified photoresist layer 200. This process is the same process as described in reference to FIG. 1B using fluorocarbon etchants. Preferably, the etch process is performed in the same chamber as the trim step. A transition step purges the chamber in preparation for the fluorocarbon etch of the first hard mask layer 210. The etch process etches the first hard mask layer 210 selectively against the second hard mask layer 220. As above, a dry etch process is preferably used to etch the first hard mask layer 210. Preferably, a high density plasma is used. More preferably, the etch process uses a fluorocarbon plasma. As discussed above, other etch processes can be used, but the selectivity of the dry etch process described above combined with the convenience of using the same chamber as the etch process for the second hard mask layer 220, make the dry etch process with a fluorocarbon plasma a very efficient option for transferring the pattern with smaller features from the photoresist layer 200 to the first hard mask layer 210.

Once the first hard mask layer 210 has been etched, the second hard mask layer 220 can be etched to form elements corresponding to the elements of the first hard mask layer 210. The second hard mask layer 220 is preferably etched according to the DDE carbon etch step using a plasma formed from $SO_2$ as described above. Similar process conditions as provided above for the two preferred chambers can be used. Because of the high relative selectivity using the DDE carbon etch step, a thin first hard mask layer 210 can be used to etch a thick second hard mask layer 220. The results of the DDE carbon etch process, and the completed hard mask structure, can be seen in FIG. 2D.

As discussed above, the substrate 230 can be etched using the second hard mask layer 220, which is preferably amorphous carbon, as a hard mask. Any remaining hard mask layers may be removed, if desired, either immediately after processing the substrate or after subsequent processing.

Growth of Features in the Pattern

One method of adjusting the CD is to grow features corresponding to physical elements in the photoresist layer 100 in underlying hard masks. There are several possible methods of growing features in a pattern to increase the CD and decrease gaps in the pattern. Referring now to FIG. 3A, the elements of the photoresist layer 300, which preferably correspond to features in a pattern, are developed in the photoresist layer 300 are grown between developing the physical elements of the resist layer 300 and etching the substrate 330. The features of the pattern can be modified to grow the features at a variety of mask levels including during, before, or after transferring the pattern from the photoresist layer 300 to the first hard mask layer 310. In preferred embodiments, the feature growth step can be accomplished by either depositing polymer on the elements in the photoresist layer 300 or by sloping elements of one or more layers beneath the photoresist layer 300.

In a preferred embodiment illustrated in FIGS. 3A-3D, a first pattern in the photoresist layer 300 can be grown by growing polymer on the sides of the resist elements. Using this process, the polymer layer that is grown on the resist sidewalls is between about 1 nm and 50 nm, more preferably between about 10 nm and 40 nm. The thickness of the polymer is determined by the length of the polymer deposition step and other factors.

A method for depositing such a polymer on a surface using fluorocarbon plasma is described in U.S. Pat. No. 6,716,758, issued to Donohoe, et al., which is incorporated by reference herein. Preferably, polymers are deposited on the sidewalls of the resist using the products of a $CHF_3$, $CF_4$, or other fluorocarbons. Using methods described in the '758 patent, polymer is deposited on the sidewalls at a greater rate than on horizontal surfaces. Several parameters, including bias power, source power, and flow rates, can be modified to modify the deposition rate of polymer on the intended target. Changing the bias power can be also provide deposition directionality for vertical sidewalls.

In FIG. 3A, a patterned photoresist layer 300 is shown over a first hard mask layer 310. A second hard mask layer 320 is shown beneath the first hard mask layer 310 and over the substrate 330. Thicknesses of these layers are similar to thicknesses of the embodiment illustrated in FIG. 1A.

Figure 3B:
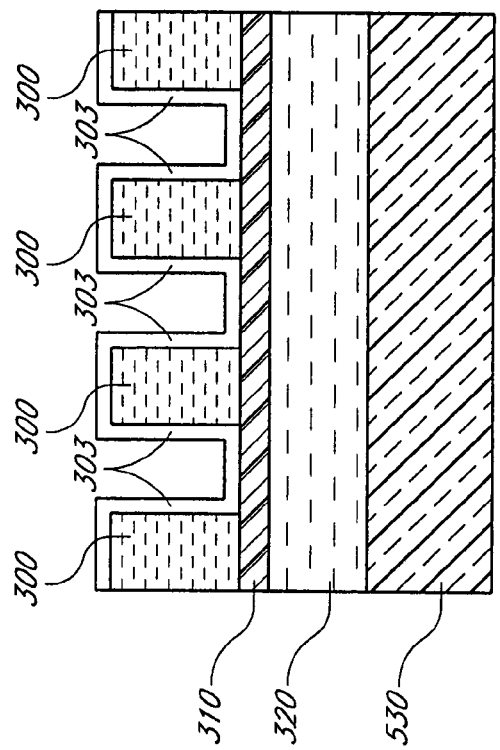
Figure 3A:
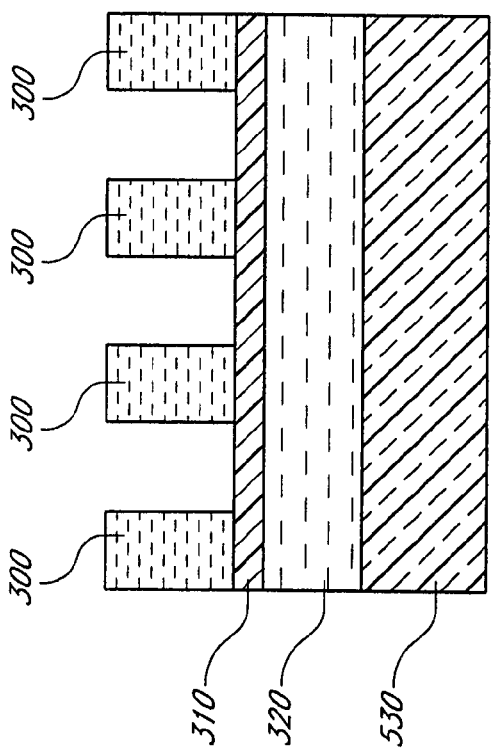

In FIG. 3B, polymer 303 has been deposited on the sidewalls of the physical elements of the photoresist layer 300. Preferably, the polymer 303 is deposited according to the methods described in the '758 reference incorporated above.

In FIG. 3C, the first hard mask layer 310 has been etched using the pattern with polymer-modified features. The etching of the first hard mask layer 310 is preferably accomplished in a similar manner as described in reference to previous embodiments.

In FIG. 3D, the second hard mask layer 320 has been etched. Preferably, the second hard mask layer 320 is an organic layer, more preferably an amorphous carbon layer. The second hard mask layer 320 is preferably etched using a sulfur and oxygen based DDE carbon etch step as described above.

In another preferred embodiment seen in FIGS. 4A-4E, elements of the first hard mask layer 410 are sloped during the fluorocarbon etch to grow the features of the pattern. Typically, sloping of the hard mask is avoided by skilled artisans because the slope might cause a slope in the underlying substrate. In a preferred embodiment, the first hard mask layer 410 is used with a second hard mask layer 420. The second hard mask layer 420 is preferably amorphous carbon which can be etched using the DDE carbon etch step described above with respect to FIG. 1C. Because the selectivity of the etch that transfers the pattern from the first hard mask layer 410 to the second hard mask layer 420 is excellent, the pattern can be successfully transferred from sloped elements in the first hard mask layer 410 while still creating vertical sidewalls in the physical elements of the second hard mask layer 420.

In FIG. 4A, the photoresist layer is between about 1500 Å and 2500 Å, more preferably between about 1750 Å and 2250 Å. The first hard mask layer 410 is preferably between about 100 Å and 1000 Å, more preferably between about 150 Å and 900 Å. The second hard mask layer 420 is preferably between about 1000 Å and 12,000 Å, more preferably between about 2000 Å and 10,000 Å.

A BARC layer can also be used to facilitate the resist development and the alteration of the CD. Preferably, the BARC layer is between the photoresist layer 400 and the inorganic hard mask layer 410. If the BARC layer is used, it is preferably between 200 Å and 1000 Å, more preferably between 300 Å and 800 Å. FIGS. 5A-5D and the accompanying text illustrate using a BARC layer 505 to grow the features in a pattern.

The sloping of the elements of the first hard mask layer 410 grows the features in the pattern. The slope on edges of the physical elements of the first hard mask layer 410 is determined by the etching conditions. By adjusting the conditions of the etching process of the first hard mask layer 410, particularly decreasing the bias power, the etch becomes more isotropic. In a preferred embodiment, the bias power is decreased to form a more sloped first hard mask layer 410. Bias power to slope films can range from about 0 W to 600 W. In a preferred embodiment using preferred materials, the bias power used to slope the first hard mask layer 410 is between about 0 W and 100 W, more preferably between about 0 W and 60 W.

Preferably, the first hard mask layer 410 is sloped using a fluorocarbon plasma etch, more preferably a high density plasma fluorocarbon plasma etch. Preferably, the plasma uses inert gases to stabilize the plasma and uses $CF_4$ as an etchant.

The sloping and etching of the underlayer is preferably accomplished using either the Lam TCP9400 chamber or Applied Materials' IPS chamber. Using the LAM TCP chamber, the pressure is preferably between 3 mTorr and 50 mTorr, more preferably between about 5 mTorr and 40 mTorr. The ionizing source power is preferably between 175 W and 1200 W, more preferably between about 200 W and 1000 W. The bias power is preferably between about 0 W and 400 W, more preferably between about 25 W and 300 W. The bias power can be adjusted to modify the slope of the first hard mask layer 410. The electrode temperature is between about −5° C. and 15° C., more preferably between about 0° C. and 10° C. Preferred source gases include $CF_4$, He, and Ar. In a preferred single wafer embodiment, the flow rate for $CF_4$ is preferably between about 5 sccm and 200 sccm, more preferably between about 10 sccm and 150 sccm. The flow rate for He is preferably between about 0 sccm and 175 sccm, more preferably between about 0 sccm and 150 sccm. The flow rate for Ar is preferably between about 0 sccm and 175 sccm, more preferably between about 0 sccm and 150 sccm.

Using the Applied Materials' IPS chamber, the pressure is preferably between 5 mTorr and 35 mTorr, more preferably between about 7 mTorr and 30 mTorr. The ionizing source power is preferably between 375 W and 1100 W, more preferably between about 400 W and 1000 W. The bias power, which is modified to alter the slope of the first hard mask layer 410, is preferably between about 0 W and 600 W, more preferably between about 25 W and 500 W. The electrode temperature is between about −25° C. and 15° C., more preferably between about −20° C. and 10° C. Preferred source gases include $CF_4$, Ar, He, and $N_2$. In a preferred single wafer embodiment, the flow rate for $CF_4$ is preferably between about 10 sccm and 75 sccm, more preferably between about 20 sccm and 60 sccm. The flow rate for Ar is preferably between about 0 sccm and 175 sccm, more preferably between about 0 sccm and 140 sccm. The flow rate for He is preferably between about 0 sccm and 175 sccm, more preferably between about 0 sccm and 150 sccm. The flow rate for $N_2$ is preferably between about 0 sccm and 110 sccm, more preferably between about 0 sccm and 100 sccm.

Figure 4C:
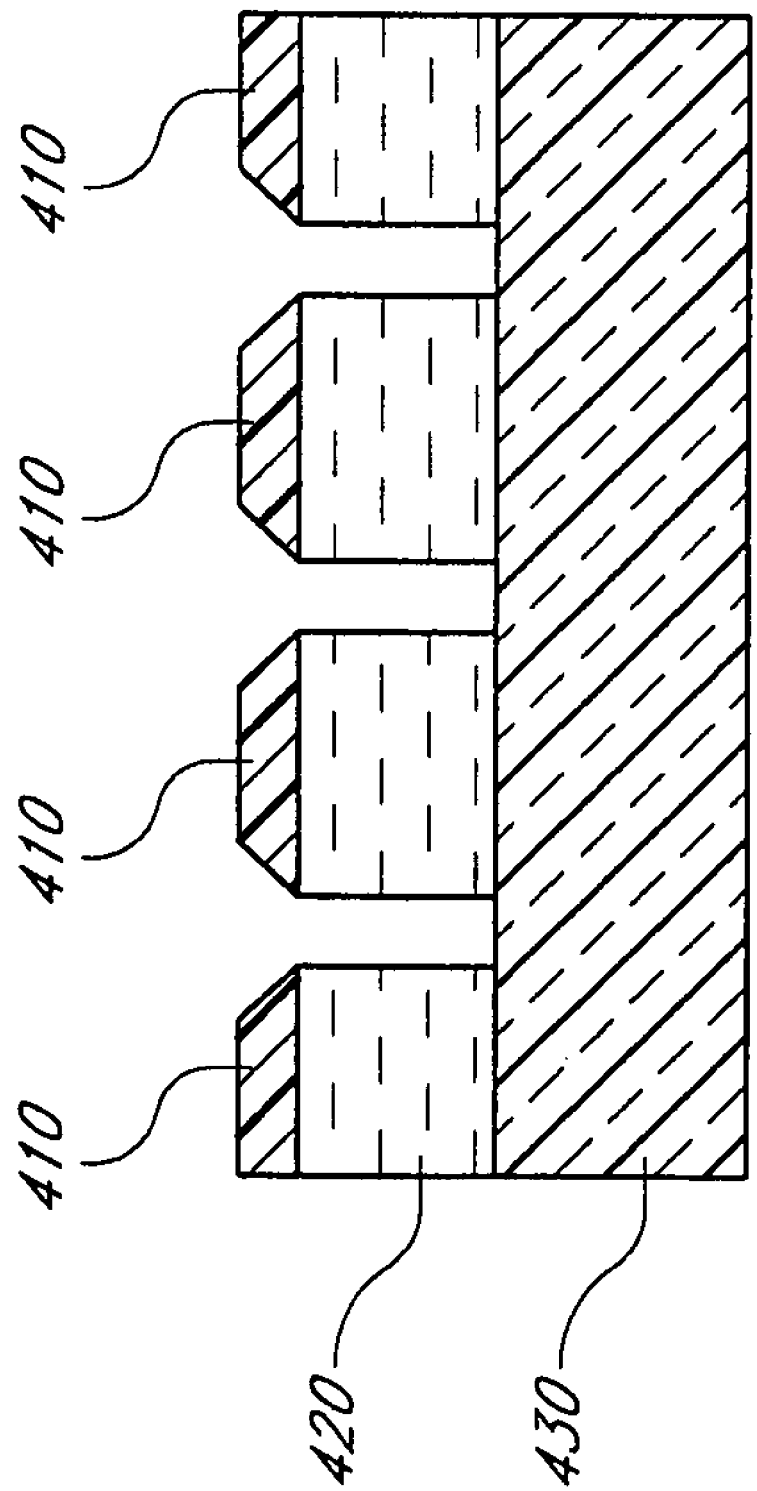

Once the features of the pattern are grown by sloping the elements of first hard mask layer 410, the pattern is transferred into the second hard mask layer 420. This produces larger physical elements of the second hard mask layer 420 that correspond to elements of the photoresist layer. This is illustrated in FIG. 4C. Preferably, the second hard mask layer 420 is an organic layer, more preferably a carbon layer, most preferably an amorphous carbon layer. The second hard mask layer 420 is preferably etched using the DDE carbon etch step as described in reference to FIG. 1C. Because the selectivity of the DDE organic etch process is excellent, the pattern can be effectively transferred to the second hard mask layer 420 from the sloped first hard mask layer 410.

After etching the second hard mask layer 420, the substrate 430 is preferably etched using a directional plasma etch. An etch stop layer can also be formed beneath the second hard mask layer 420 so that the substrate is not etched during the DDE organic etch process. The substrate can be processed (e.g., etched) in the same chamber, or it can be transferred to a new chamber. The carbon hard mask provides a good protection for the substrate during subsequent processing.

Process to Decrease Line Edge Roughness

When growing the pattern as described above, the line edge roughness can be increased. Line edge roughness can be reduced by performing a shrinkage step before, during, or after performing a growth step on the features of a pattern. Preferably, the features in the pattern are grown before they are shrunk. The importance of smooth resist profiles has become increasingly important with smaller CDs. As discussed above, the use of a DDE carbon etch step is an effective tool for transferring patterns from the photoresist layer to a carbon based hard mask. DDE can be used to extend the CD capability of photolithography, especially for lithography nodes below 248 nm UV. Currently, 193 nm lithography generally has a smaller process window than 248 nm lithography, which results in a very limited capacity for CD adjustment and rough resist edges. However, shrinkage and growth steps can increase the capacity for CD adjustment and increase the process window of 193 nm lithography as well as other lithography nodes.

Another benefit of shrinking the feature using a dry develop shrinkage step is that the shrinking process has the desirable side effect of reducing the line edge roughness of the feature. The dry develop etch process attacks the roughness, or the asperities, of the mask elements. Growing the resist elements, as described above, can involve using a polymer deposition step in the etch sequence or sloping an underlayer. The polymer deposition follows the contours of the original physical element. So, if the original element is rough, the element will be at least as rough as the original resist element after the polymer deposition step. In fact, as the element is grown, roughness increases. Asperities are magnified by the polymer deposition process. For example, a 16 nm growth step will produce substantially more edge roughness than an 8 nm growth step. For future generations, such asperities can hamper device performance. For example, when defining a 60 nm gate for a transistor, a 6 nm asperity would yield a 10% variation. Such a variation could cause substantial unpredictability in the resulting device. Similarly, a sloped underlayer can follow the asperities of the resist elements and lead to increased line edge roughness.

In order to combat the increase of asperities that are magnified as a side effect of the growth step, a shrinkage step is preferably performed before the growth step is commenced. The shrinkage step will smooth the resist elements, which will present a better surface on which to perform the polymer deposition step of the grow process. In this manner, there will be fewer asperities to be magnified by the polymer deposition process. An increase in the critical dimension can be achieved without the normally accompanying increase of LER.

In a preferred embodiment, the resist elements of the photoresist layer 500 are shrunk between about 3 nm and 20 nm, more preferably between about 5 nm and 10 nm. By using this shrinkage step with a low amount of shrinkage, the pattern is preserved and the starting surface for the polymer deposition step is smoother.

In another preferred embodiment illustrated in FIGS. 5A-5D, the growth step is accomplished by sloping an underlayer. Instead of using a polymer growth deposition step, the underlayer is sloped so that the layer beneath the underlayer can be etched with a larger CD. In a preferred embodiment, the underlayer 505 is a BARC layer, more preferably an organic BARC layer. Preferred BARC materials include organic materials which reflect the wavelength of light that is used to pattern the photoresist layer 500. The BARC layer 505 can be sloped during the isotropic sulfur-based plasma trim etch as described above. This process can simultaneously trim and smooth elements in the mask pattern and slope the BARC layer to provide a wider mask profile to etch the first hard mask layer 510. The ultimate size of the elements defined by the sloped BARC layer 505 can be tuned through routine experimentation with the bias power, among other variables. In general, greater isotropicity will smooth and shrink horizontal dimensions of the resist 500 and also increase the amount of BARC sloping, but the relative effects can be tuned, e.g., by adjusting bias levels.

Figure 5A:
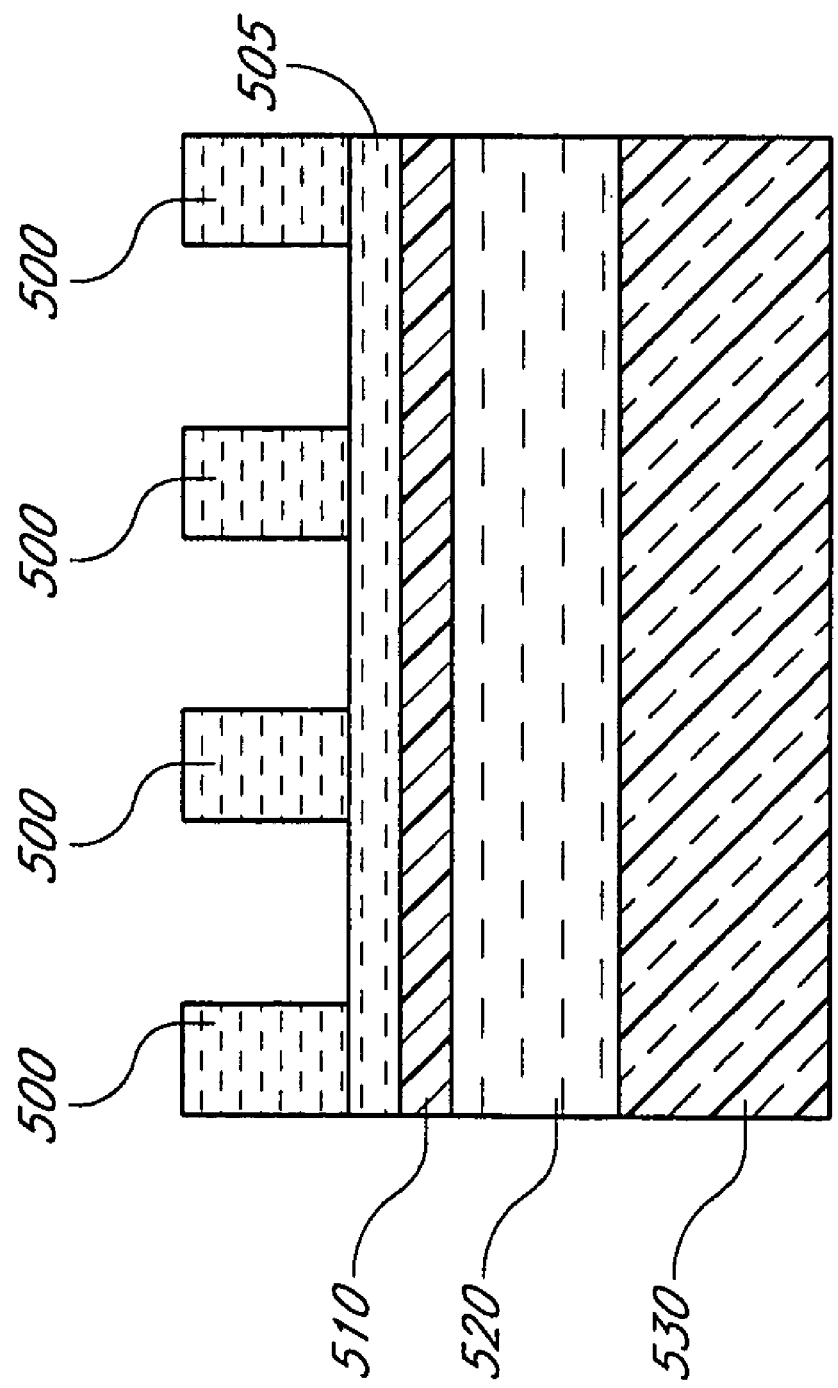
FIGS. 5A-5D illustrate a combined shrinking and growing of the resist elements to form a hard mask with an altered critical dimension according to an embodiment of the invention.

In FIG. 5A, a photoresist layer 500 consisting of several resist physical elements is seen over an underlayer 505. A first hard mask layer 510 is beneath the underlayer 505. FIG. 5A shows a second hard mask layer 520, which is preferably organic, more preferably amorphous carbon, over a substrate 530.

Figure 5C:
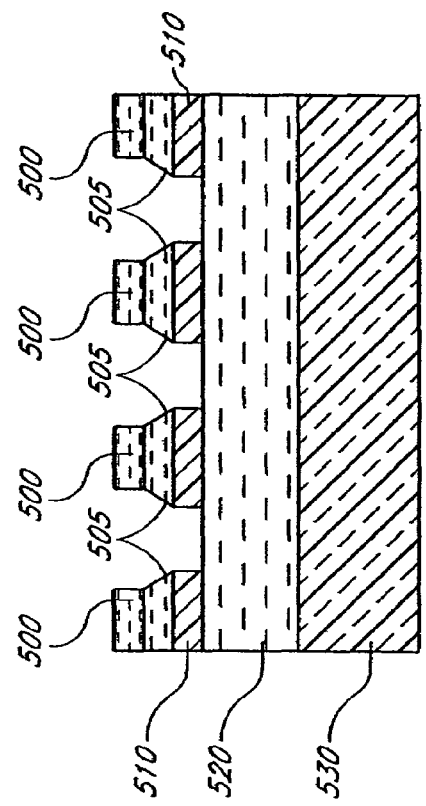
Figure 5B:
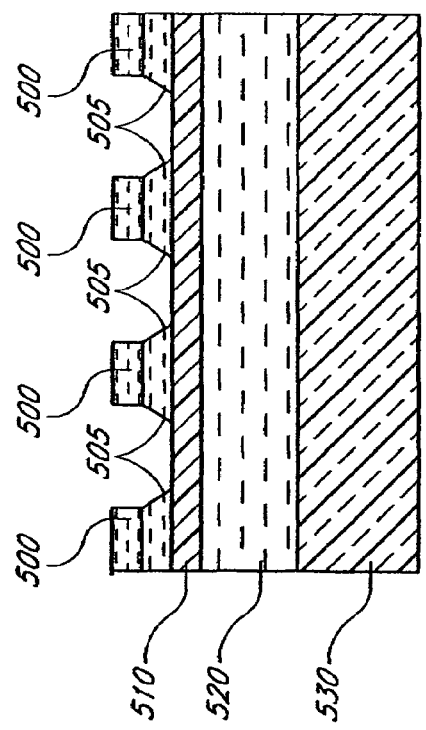

FIG. 5B shows the process of altering the CD by trimming the resist layer 500 and sloping the elements of BARC layer 505. The BARC layer image is then used to etch the first hard mask layer 510, as illustrated in FIG. 5C. Preferably, the first hard mask layer is an inorganic layer and is etched by a fluorocarbon high density plasma process.

Figure 5D:
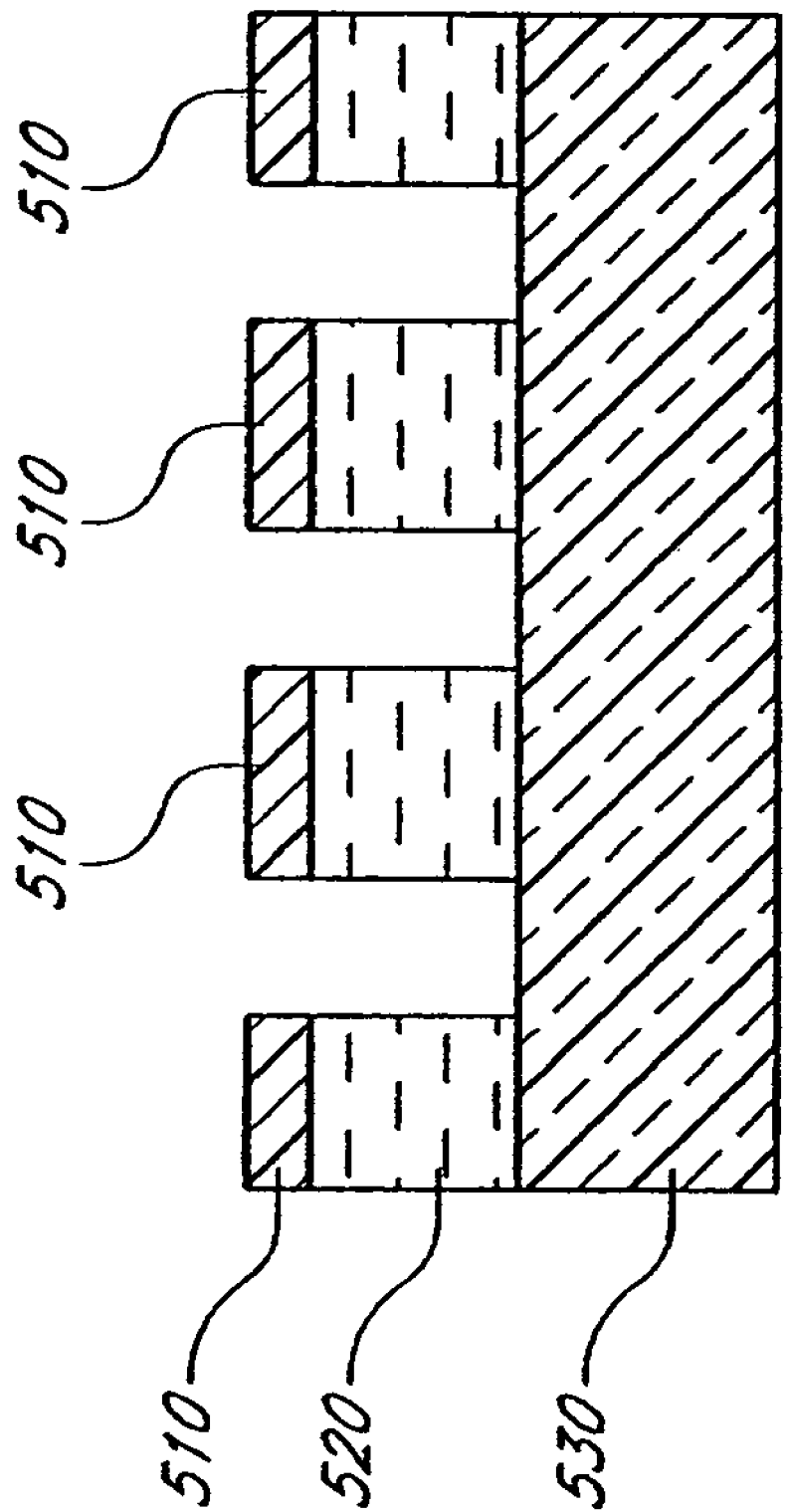

Preferably, a directional DDE carbon etch step is then used to etch the second hard mask layer 520 as illustrated in FIG. 5D. In a preferred embodiment, the second hard mask layer 520 is amorphous carbon. Preferably, a dry etch using a sulfur-based etchant is used to etch the amorphous carbon hard mask as described with reference to FIG. 1C. The organic layers above the first hard mask layer 510 may be removed during this etch process, but the first hard mask layer 510 is preferably not substantially etched due to the excellent selectivity of the $SO_2$-based etchant against preferred materials for the first hard mask layer 510. As discussed in reference to a previous embodiment, the second hard mask layer 520 is preferably etched at a rate of above about 15 times faster than the etch rate of the first hard mask layer 510, more preferably above about 30 times faster.

The timing and mask stage of the shrinkage and growth steps can vary from the preferred embodiments. For example, the shrinkage step is preferably performed before the polymer deposition step in one embodiment described above, but the sloping step is preferably performed simultaneously with the shrinkage step in another embodiment. Other options of timing also exist, such as performing a growth step on the elements of the resist mask followed by a shrinkage step, or growing the elements of the first hard mask layer 510 before shrinking the elements of the second hard mask layer 520. However, preferably the elements of the resist layer 500 are shrunk before or during a growth step on the features of the pattern in an underlying mask layer. This sequence provides excellent smoothing of the features.

Although this invention has been described in terms of certain preferred embodiments, other embodiments that are apparent to those of ordinary skill in the art, including embodiments that do not provide all of the features and advantages set forth herein, are also within the scope of this invention. Accordingly, the scope of the present invention is defined only by reference to the appended claims.

We claim:

1. A method for altering a critical dimension in an integrated circuit comprising:
    patterning a photoresist layer to form a plurality of resist elements;
    shrinking at least some of the resist elements to provide shrunken resist elements;
    etching a first hard mask layer to form a pattern corresponding to the shrunken resist elements to form a plurality of physical elements of the first hard mask layer; and
    transferring the pattern from the first hard mask layer into a substantially carbon layer using an etchant comprising sulfur and oxygen.

2. The method of claim 1, wherein etching the first hard mask layer comprises sloping at least some of the plurality of physical elements of the first hard mask layer.

3. The method of claim 1, further comprising depositing polymer on at least some of the shrunken resist elements.

4. The method of claim 1, wherein shrinking the resist elements comprises etching using a plasma comprising sulfur and oxygen.

5. The method of claim 1, wherein etching the first hard mask layer comprises forming the pattern in an inorganic material.

6. The method of claim 5, wherein forming a pattern in an inorganic material comprises forming a pattern in at least one of silicon nitride, silicon oxide, and dielectric anti-reflective coatings (DARCs).

7. A method of etching for an integrated circuit with a substantially carbon layer comprising:
    patterning a first hard mask layer to form a pattern comprising a plurality of physical elements of the first hard mask layer, wherein patterning the first hard mask layer comprises patterning an inorganic layer formed over the first hard mask layer; and
    transferring the pattern from the first hard mask layer to a substantially carbon layer using an etchant consisting essentially of sulfur and oxygen, wherein the sulfur and oxygen are supplied through a plasma.

8. The method of claim 7, further comprising etching a layer beneath the substantially carbon layer using the substantially carbon layer as a hard mask.

9. The method of claim 7, wherein patterning an inorganic layer comprises patterning a layer comprising at least one of silicon nitride, silicon oxide, and dielectric anti-reflective coatings (DARCs).

10. The method of claim 7, wherein patterning the inorganic layer comprises using a fluorocarbon anisotropic etch process.

11. The method of claim 7, further comprising sloping the physical elements of the first hard mask layer.

12. The method of claim 7, wherein transferring the pattern to a substantially carbon layer comprises transferring the pattern to an amorphous carbon layer.

13. The method of claim 12, wherein transferring the pattern to an amorphous carbon layer comprises transferring the pattern to a transparent amorphous carbon layer.

14. The method of claim 7, further comprising shrinking at least some of the physical elements of the first hard mask layer of the pattern before transferring the pattern to the substantially carbon layer.

15. The method of claim 7, wherein the plasma further comprises at least one inert gas.

16. The method of claim 11, wherein sloping the physical elements of the first hardmask layer comprises using a bias power of between about 0 W and 100 W.

17. The method of claim 7, wherein the etchant comprises sulfur dioxide.

18. The method of claim 17, wherein transferring the pattern comprises providing sulfur dioxide at a flow rate between about 5 sccm and 75 sccm.

* * * * *